(12) United States Patent
Ohta et al.

(10) Patent No.: US 7,265,044 B2
(45) Date of Patent: Sep. 4, 2007

(54) METHOD FOR FORMING BUMP ON ELECTRODE PAD WITH USE OF DOUBLE-LAYERED FILM

(75) Inventors: Masaru Ohta, Tokyo (JP); Katsumi Inomata, Tokyo (JP); Shinichiro Iwanaga, Tokyo (JP)

(73) Assignee: JSR Corporation, Tokyo (JP)

( * ) Notice: Subject to any disclaimer, the term of this patent is extended or adjusted under 35 U.S.C. 154(b) by 195 days.

(21) Appl. No.: 10/524,510

(22) PCT Filed: Aug. 21, 2003

(86) PCT No.: PCT/JP03/10569

§ 371 (c)(1),
(2), (4) Date: Feb. 14, 2005

(87) PCT Pub. No.: WO2004/019667

PCT Pub. Date: Mar. 4, 2004

(65) Prior Publication Data

US 2005/0277245 A1  Dec. 15, 2005

(30) Foreign Application Priority Data

Aug. 22, 2002 (JP) ............................. 2002-242509
Jan. 31, 2003 (JP) ............................. 2003-023602

(51) Int. Cl.
*H01L 21/44* (2006.01)
(52) U.S. Cl. ...................... 438/612; 257/737; 257/738; 438/613; 438/632; 438/646

(58) Field of Classification Search ................ 438/612, 438/613, 632, 646; 257/737, 738
See application file for complete search history.

(56) References Cited

U.S. PATENT DOCUMENTS

| 6,420,255 B1 | 7/2002 | Takahashi |
| 6,525,275 B1* | 2/2003 | Asai ........................... 174/255 |
| 2002/0130411 A1* | 9/2002 | Cheng et al. ............... 257/737 |
| 2003/0145949 A1* | 8/2003 | Tanaka et al. .............. 156/330 |
| 2006/0063366 A1* | 3/2006 | Watanabe et al. .......... 438/613 |

FOREIGN PATENT DOCUMENTS

| JP | 5-160557 | 6/1993 |
| JP | 06-350230 | 12/1994 |

(Continued)

*Primary Examiner*—Thao P. Le
(74) *Attorney, Agent, or Firm*—Oblon, Spivak, McClelland, Maier & Neustadt, P.C.

(57) ABSTRACT

A process for forming bumps on electrode pads for a wiring board including a substrate and a plurality of electrode pads. The process (a) forms a laminated two-layer film on the wiring board and forms a pattern of apertures at positions corresponding to the electrode pads, the laminated two-layer film including a lower layer containing an alkali-soluble radiation-nonsensitive resin composition and an upper layer containing a negative radiation-sensitive resin composition; (b) fills a low-melting metal in the aperture pattern; (c) reflows the low-melting metal by pressing or heating to form bumps; and (d) peels and removes the laminated two-layer film from the board. The laminated film including two layers with different properties permits high resolution and easy peeling.

13 Claims, 6 Drawing Sheets

FOREIGN PATENT DOCUMENTS

| | | |
|---|---|---|
| JP | 8-298369 | 11/1996 |
| JP | 8-301911 | 11/1996 |
| JP | 10-112580 | 4/1998 |
| JP | 11-15150 | 1/1999 |
| JP | 2000-208911 | 7/2000 |
| JP | 2001-11494 | 1/2001 |
| JP | 2001-189552 | 7/2001 |
| JP | 2002-139835 | 5/2002 |
| JP | 2002-170827 | 6/2002 |

* cited by examiner low-melting metal ball 308 low-melting metal film 408 formed by electrolytic deposition low-melting metal ball 708 low-melting metal film 808 formed by electrolytic deposition

METHOD FOR FORMING BUMP ON ELECTRODE PAD WITH USE OF DOUBLE-LAYERED FILM

CROSS-REFERENCE TO RELATED APPLICATION

This application is a 371 of PCT/JP03/10569, filed Aug. 21, 2003, which claims the benefit of Japan Patent Application No. 2002-242509, filed Aug. 22, 2002 and Japan Patent Application No. 2003-23602, filed Jan. 31, 2003, the contents of which are hereby incorporated herein by reference in their entirety.

FIELD OF THE INVENTION

The present invention relates to a process for forming low-melting metal bumps such as solder bumps used in the mounting of IC chips on a multilayer printed wiring board.

BACKGROUND OF THE INVENTION

Low-melting metal bumps such as solder bumps are used for the mounting of IC chips and the like. Formation of such bumps takes place on the IC chips or on the multilayer printed wiring board.

BGA (ball grid array) is a form of package in which the bumps are provided to an IC chip. This term generally refers to a package in which the IC chip is mounted on a package substrate.

WL-CSP (wafer level-chip size packaging) is a new technology for the high-density mounting. In the WL-CSP, a plurality of IC chip circuits is formed on one wafer and collectively subjected to electrode formation, packaging and burn-in test; thereafter the wafer is cut into IC chip packages.

Collective electrode formation in the WL-CSP may be performed by electrolytic deposition, filling a metal paste followed by reflowing, or placing metal balls followed by reflowing.

The increase of IC chip density has lead to higher density and miniaturization of bumps on the IC chip. Solder bumps have increasingly been studied and been in practical use in the WL-CSP mounting technology because they allow both connection reliability and reduction of processing cost. Specifically, the solder bumps are formed by electrolytic deposition using a mask that is produced by patterning a film of at least 50 μm thickness formed by application or lamination of a positive or negative liquid resist or dry film.

Meanwhile, when the solder bumps are provided to a multilayer printed wiring board, a solder resist layer is formed on the wiring board to prevent fusion bonding between the solder bumps. The solder resist layer is provided with apertures at positions corresponding to electrode pads. To form the solder bumps in the solder resist layer, mask printing of a solder paste is performed. The mask used in the mask printing has a pattern (pattern of apertures) that corresponds to the apertures of the solder resist layer. In carrying out the mask printing, the mask is placed on the solder resist layer so as to align the mask pattern and the apertures of the solder resist layer. The solder paste is then printed through the mask within the apertures of the solder resist layer on the electrode pads; subsequently, the solder paste is reflowed to form solder bumps on the electrode pads.

A variety of studies have been made to cope with reduction of solder bump pitches. For example, JP-A-H06-350230 discloses formation of a peelable solder dam resist on a solder resist, and JP-A-2000-208911 discloses a method wherein a dry film is laminated on the solder resist layer, apertures are created at positions corresponding to electrode pads, a solder paste is applied followed by reflowing, and the dry film is peeled.

In the aforementioned process of bump formation, the positive resist, although easily peelable in general, causes difficult control of the aperture pattern configuration, often resulting in nonuniform bump size.

On the other hand, the negative resist permits relatively easy control of pattern shape, but is generally difficult to peel because of its photocrosslinking characteristics. In particular, when the solder bumps are formed by filling and reflowing the paste, the resist becomes even more difficult to peel from the board because the crosslinking in the negative resist proceeds to a further extent by the heat applied in the reflowing.

The resist film peeling is generally performed by spray method with an aqueous solution of sodium hydroxide or sodium carbonate. For the dry-film or liquid negative resist, dip method has been increasingly employed with use of a peeling solution that contains a highly polar solvent and an organic alkali. The former method, although inexpensive, often results in residual resist around the bumps having a high density, and causes deterioration of the bumps. The latter method has disadvantages that the peeling solution is expensive, and the metal surface of the bumps and the underlying board surface are corroded when the organic alkali concentration and the peeling solution temperature are increased for improving the peeling efficiency per amount of the peeling solution.

DISCLOSURE OF THE INVENTION

The present invention has been made to solve the aforesaid problems. As shown in FIGS. 1(a) and 5(a), a laminated two-layer film is formed on a wiring board, which two-layer film includes a lower layer comprising an alkali-soluble radiation-nonsensitive resin composition and an upper layer comprising a negative radiation-sensitive resin composition. Thereafter, photoexposure and development are performed one time to create a pattern of apertures for bump formation at positions corresponding to electrode pads.

The laminated film of the invention includes two layers having different properties, so that both high resolution and easy peeling property are achieved. Namely, the use of the lower layer that comprises a compound having a phenolic hydroxyl group leads to the following effects:

(1) The lower layer exhibits adequate alkali developability to permit patterning by one operation of photoexposure and development.

(2) The phenolic hydroxyl group in the resin composition of the lower layer functions to deactivate photo-radicals to inhibit curing reaction at the interfaces between the upper and lower layers and between the lower layer and the board even if intermixing of the upper and lower layers has taken place. As a result, good peelability of the laminated two-layer film can be maintained.

Accordingly, the negative resist traditionally unsuitable for use due to poor peelability can be used as upper layer. The use of the negative resist as the upper layer permits sufficient mechanical strength of the resist pattern required in the step of filling a low-melting metal into the bump-formation aperture pattern as illustrated in FIG. 1(b) or 5(b).

Furthermore, the lower layer has excellent peelability such that it can be peeled even by single use of a highly polar organic solvent such as dimethyl sulfoxide or N-methylpyrrolidone. The peeled pieces have the upper layer that has been crosslinked and is hardly soluble in such highly polar organic solvents. Accordingly, the peeled pieces can be easily removed by precipitation separation or cycle filtration.

When the peel treatment employs a peeling apparatus having multistage immersion baths, the treatment may be designed to peel most of the negative resist film in the first bath containing the organic solvent, and to remove the residues of the lower layer in the second and later baths filled with a peeling solution containing an alkali component. Thus, the peeling efficiency can be improved without increasing the alkali concentration of the peeling solution, and the damage to the solder bumps and the underlying board can be minimized.

PREFERRED EMBODIMENTS OF THE INVENTION

Hereinbelow, the process of bump formation according to the present invention will be described with reference to the drawings.

Figure 1:
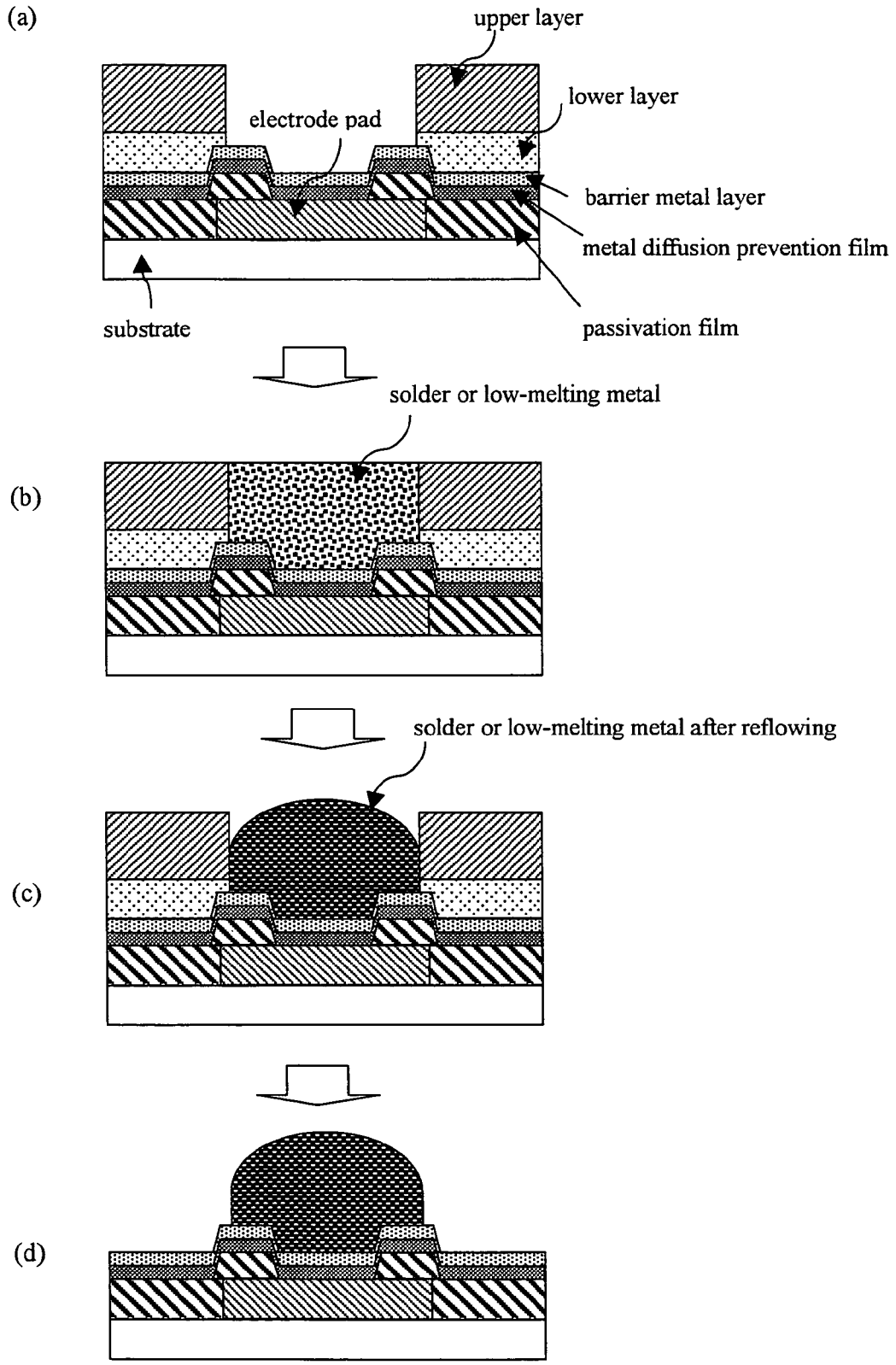
FIG. 1 is a schematic sectional view illustrating a process of bump formation according to the present invention.
Figure 2:
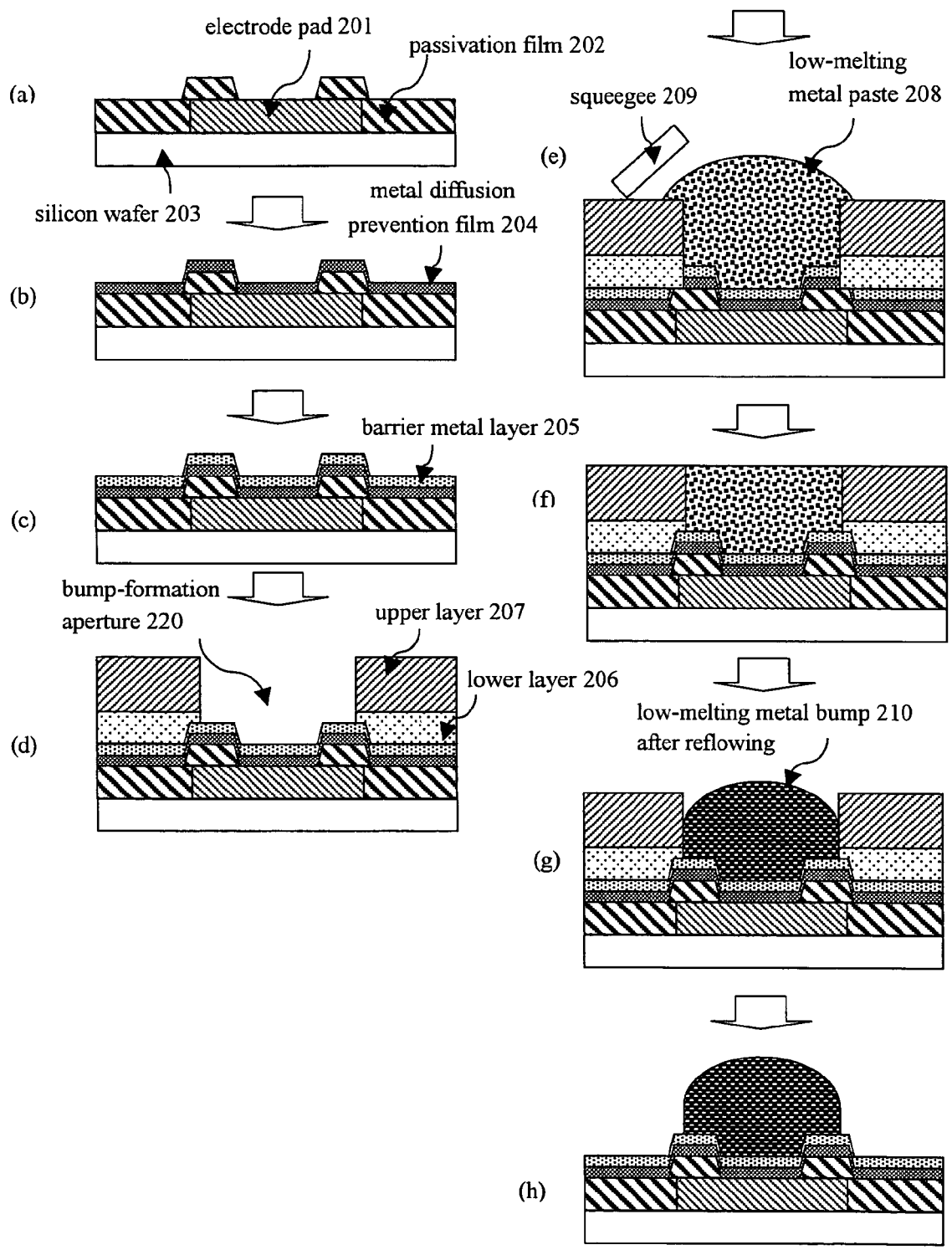
FIG. 2 is a schematic sectional view illustrating a process of bump formation according to the present invention.

A first embodiment of the process for forming bumps on electrode pads according to the invention will be explained in great detail with reference to FIG. 2. In the present embodiment, a wiring board includes a silicon wafer 203 as substrate, and a plurality of electrode pads 201 provided on the substrate surface. Bump-formation apertures 220 are filled with a low-melting metal paste represented by solder paste. A passivation film 202 is formed so as to embed the side surfaces and end surfaces of the electrode pads 201.

FIG. 2(a) shows a sectional structure of a semiconductor chip wafer in which the electrode pads 201 are arranged so as to form an area over the entire surface of the semiconductor. When the electrode pads 201 have been formed on the silicon wafer 203, the wiring board is covered with the passivation film 202 having a thickness of, for example, 1 µm, so as to expose the major surface of the electrode pads 201.

As illustrated in FIG. 2(b), an electrode metal diffusion prevention film 204 is formed over the entire surface of the electrode pads 201 and the passivation film 202, by sputtering, deposition or the like. The metal diffusion prevention film 204 is formed using any of Ni, Cr, TiN, TaN, Ta, Nb and WN, and in a thickness of, for example, 1 µm. The metal diffusion prevention film 204 may be a single film or a laminated film.

As illustrated in FIG. 2(c), a barrier metal layer 205 is formed over the entire surface of the wiring board in which the metal diffusion prevention film 204 has been fabricated. The barrier metal layer may be produced by depositing a film of a barrier metal selected from Ti, Ni, Pd and Cu in a thickness of several thousands of angstroms with use of a sputtering apparatus or an electron-beam deposition apparatus.

As shown in FIG. 2(d), a laminated two-layer film is formed on the wiring board having the barrier metal layer 205. The laminated two-layer film includes a lower layer 206 comprising an alkali-soluble radiation-nonsensitive resin composition and an upper layer 207 comprising a negative radiation-sensitive resin composition.

For example, the lower layer 206 may be formed by applying a liquid lower layer material in a thickness of 2 to 3 µm. Thereafter, the upper layer 207 may be formed on the lower layer 206 by applying a liquid negative resist or laminating a negative dry film resist in a thickness of at least 50 µm. The resultant laminated two-layer film consisting of the lower and the upper layers 206 and 207 is irradiated with radiation through a mask and then developed to produce bump-formation apertures 220 at positions that correspond to bump formation positions above the electrode pads 201.

Possible combinations of the resists, including that in the above process, for forming the laminated two-layer film are for example:

(1) A liquid resist for the lower layer, and a liquid resist for the upper layer (2) A liquid resist for the lower layer, and a dry film resist for the upper layer (3) A dry film resist for the lower layer, and a liquid resist for the upper layer (4) A dry film resist for the lower layer, and a dry film resist for the upper layer (5) A two-layer dry film resist having a lower layer/upper layer structure As illustrated in FIG. 2(e), a low-melting metal paste 208, such as a solder paste, is filled in the bump-formation apertures 220 with use of a squeegee 209 or the like.

Referring to FIGS. 2(f) and (g), the wiring board with the metal paste filled therein is heated in a nitrogen atmosphere, and the metal paste is reflowed to produce bumps 210.

Subsequently, the laminated film is peeled as shown in FIG. 2(h). The wiring board is then electrically tested and diced into chips. The chips are subjected to the flip chip bonding.

Figure 3:
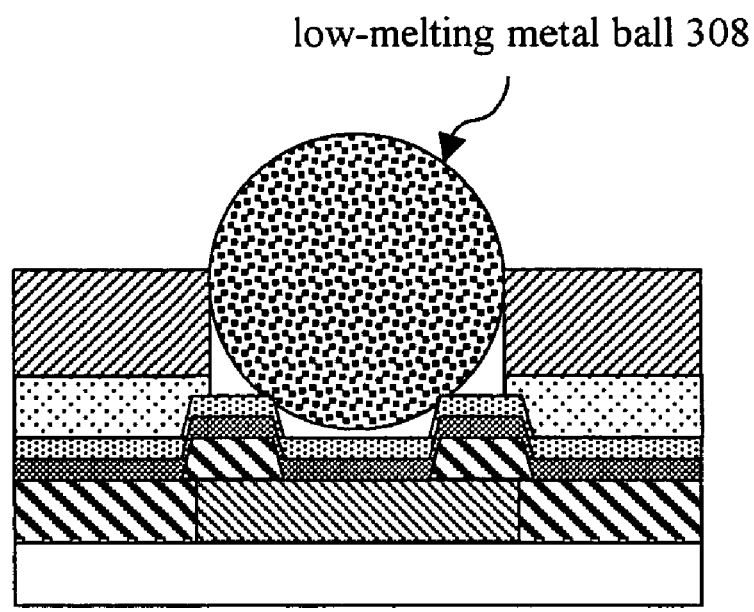
FIG. 3 is a schematic sectional view illustrating a process of bump formation according to the present invention.
Figure 4:
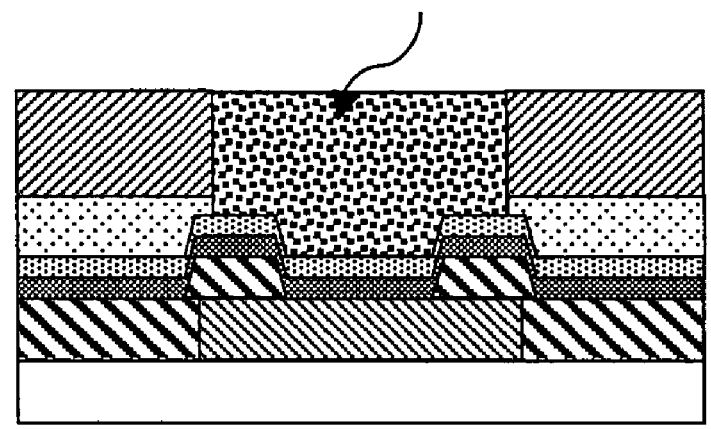
FIG. 4 is a schematic sectional view illustrating a process of bump formation according to the present invention.
Figure 5:
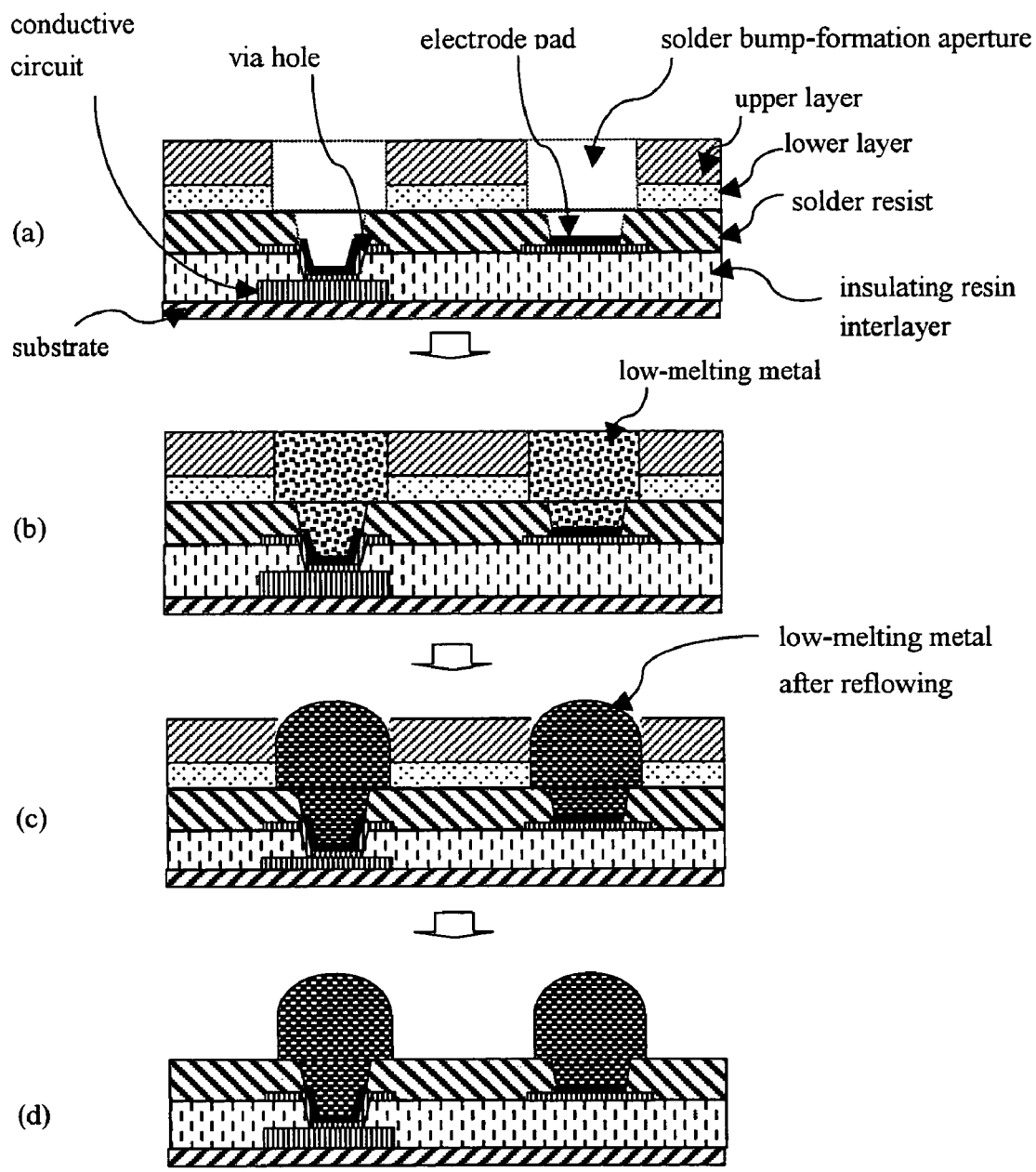
FIG. 5 is a schematic sectional view illustrating a process of bump formation according to the present invention.

Although the above-described embodiment employs a solder paste as the low-melting metal paste, good reliability may be obtained by use of a mixture of metals such as Sn, Pb, Ag, Bi, Zn, In, Sb, Cu, Bi and Ge. In the above embodiment, the low-melting metal bumps, preferably solder bumps, are produced by filling the metal into the bump-formation apertures 220 with use of the squeegee. It is also possible that the bumps are formed by placement of low-melting metal balls (solder balls) 308 as shown in FIG. 3 (second embodiment) or by electrolytic deposition of a low-melting metal film 408 as shown in FIG. 4 (third embodiment).

After the metal paste is reflowed, flux cleaning may be performed.

FIGS. 5(a) to (d) explain formation of bumps on a multilayer printed wiring board by the process of the invention. Although FIG. 5 illustrates one conductive circuit and one insulating resin interlayer, pluralities of these circuits and layers are generally present in alternate order.

Figure 6:
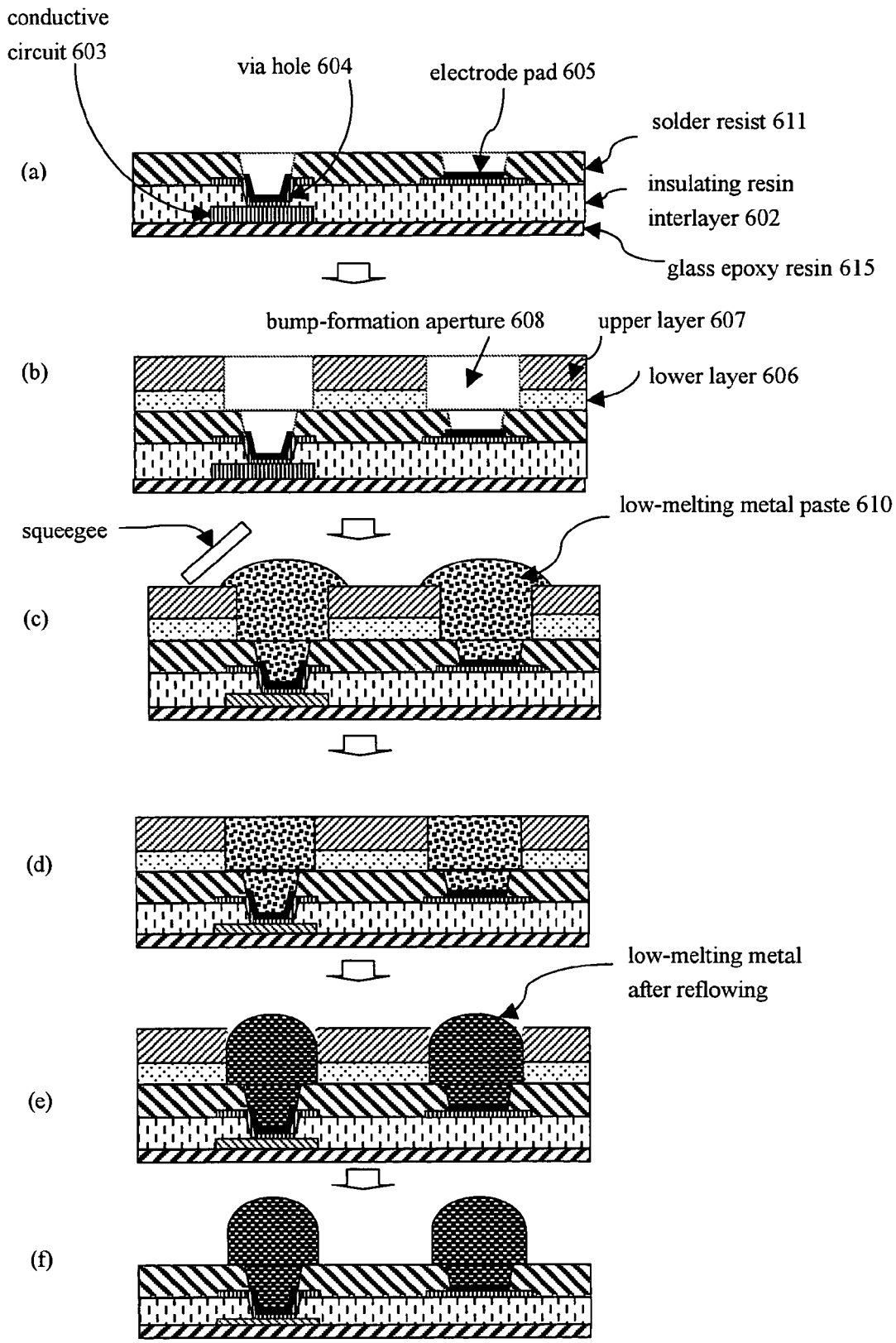
FIG. 6 is a schematic sectional view illustrating a process of bump formation according to the present invention.

A fourth embodiment of the process for forming bumps on electrode pads according to the invention will be explained with reference to FIG. 6. In the present embodiment, a wiring board comprises a substrate 615 comprising glass epoxy resin or BT (bismaleimide-triadine) resin, an insulating resin interlayer 602 overlaid on the substrate, a plurality of electrode pads 605, and a solder resist 611 formed so as to embed the side surfaces of the electrode pads. Bump-formation apertures 608 are filled with a low-melting metal paste 610, typically a solder paste, with use of a squeegee.

FIG. 6(a) shows a sectional structure of a wiring board in which the electrode pads 605 are arranged so as to form an area over the entire surface of the semiconductor. The wiring board used in this embodiment is a multilayer laminated board that includes the insulating resin interlayer 602 and the conductive circuits 603 on the glass epoxy resin 615. The conductance across the thickness of the board is obtained through via holes 604 formed by deposition. The solder resist 611 is applied over the insulating resin interlayer 602 and developed to create apertures at positions corresponding to the electrode pads therebelow. The conductive circuits 603 are partially exposed at the bottom of the apertures, and the electrode pads 605 are formed on the exposed conductive circuits 603 by electroless deposition.

As shown in FIG. 6(b), a laminated two-layer film is formed on the solder resist 611. The laminated two-layer film includes a lower layer 606 comprising an alkali-soluble radiation-nonsensitive resin composition and an upper layer 607 comprising a negative radiation-sensitive resin composition.

For example, the lower layer 606 maybe formed by applying a liquid lower layer material in a thickness of 2 to 3 μm. Thereafter, the upper layer 607 maybe formed on the lower layer 606 by applying a liquid negative resist or laminating a negative dry film resist in a thickness of at least 40 μm. The resultant laminated film is photoexposed to create a latent pattern and then developed to produce solder-bump-formation apertures 608 at positions that correspond to bump-formation positions above the electrode pads 605.

Similarly to the aforementioned embodiment using the silicon wafer substrate, possible combinations of the resists, including that in the above process, for forming the laminated two-layer film are for example:

(1) A liquid resist for the lower layer, and a liquid resist for the upper layer
(2) A liquid resist for the lower layer, and a dry film resist for the upper layer
(3) A dry film resist for the lower layer, and a liquid resist for the upper layer
(4) A dry film resist for the lower layer, and a dry film resist for the upper layer
(5) A two-layer dry film resist having a lower layer/upper layer structure As illustrated in FIG. 6(c), a low-melting metal paste 610, such as a solder paste, is filled in the bump-formation apertures 608 with use of a squeegee 609 or the like.

Referring to FIGS. 6(d) and (e), the wiring board with the metal paste filled therein is heated in a nitrogen atmosphere, and the metal paste is reflowed to produce bumps.

Subsequently, the laminated film is peeled as shown in FIG. 6(f).

Figure 7:
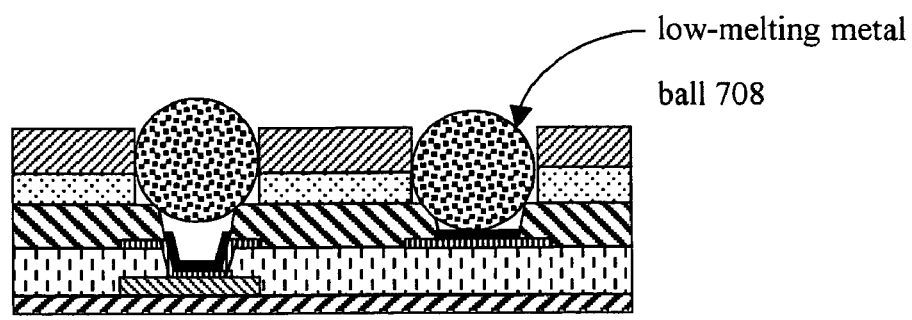
FIG. 7 is a schematic sectional view illustrating a process of bump formation according to the present invention.
Figure 8:
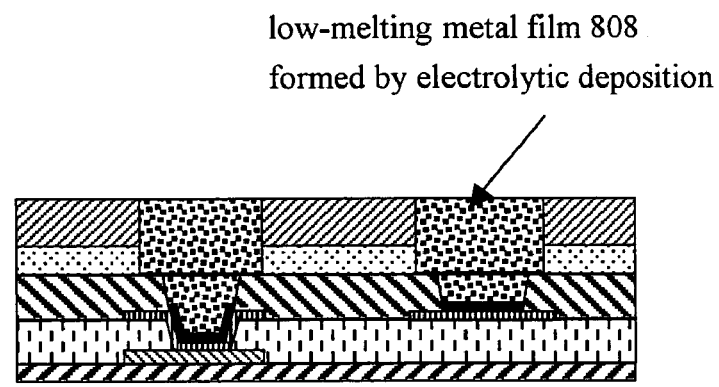
FIG. 8 is a schematic sectional view illustrating a process of bump formation according to the present invention.

Although the above-described embodiment employs a solder paste as the low-melting metal paste, good reliability may be obtained by use of a mixture of metals such as Sn, Pb, Ag, Bi, Zn, In, Sb, Cu, Bi and Ge. In the above embodiment, the low-melting metal bumps, preferably solder bumps, are formed by filling the metal into the bump-formation apertures 608 with use of the squeegee. It is also possible that the bumps are formed by placement of low-melting metal balls (solder balls) 708 as shown in FIG. 7 (fifth embodiment) or by electrolytic deposition of a low-melting metal film 808 as shown in FIG. 8 (sixth embodiment).

After the metal paste is reflowed, flux cleaning may be performed.

Hereinbelow, materials of the lower and upper layers for use in the present invention will be described.

Lower Layer

The lower layer is not particularly limited as long as it contains an alkali-soluble compound, preferably an alkali-soluble compound having a phenolic hydroxyl group. Desirably, the lower layer has a composition described below.

For the formation of the lower layer, a lower layer material is used that contains an alkali-soluble radiation-nonsensitive resin composition. The lower layer material may be a liquid or a dry film.

[Alkali-soluble Compound Having a Phenolic Hydroxyl Group: Component A]

The above title compounds (hereinafter, the compounds (A)) are broadly divided into low-molecular weight compounds having up to 10 phenol skeletons, and high-molecular weight polymers such as novolak resins and poly(4-hydroxystyrene).

When the low-molecular weight compound (A) is employed, a developing solution used for forming the apertures is preferably one relatively weak in alkalinity such as sodium carbonate. In the case of the high-molecular weight polymer, a developing solution used for forming the apertures is preferably one relatively strong in alkalinity such as tetramethylammoniumhydroxide.

Examples of the low-molecular weight compounds include 4,4'-[1-[4-[1-(4-hydroxyphenyl)-1-methylethyl]phenyl]ethylidene]diphenol, methyl 2,2-bis(1,5-dimethyl-4-hydroxyphenyl)propionate and 4,6-bis[1-(4-hydroxyphenyl)-1-methylethyl]-1,3-benzenediol.

Compounds generally used as thermal polymerization inhibitors may also be used. Examples thereof include pyrogallol, benzoquinone, hydroquinone, methylene blue, tert-butylcatechol, monobenzyl ether, methylhydroquinone, amylquinone, amyloxyhydroquinone, n-butylphenol, phenol, hydroquinone monopropyl ether, 4,4'-(1-methylethylidene)bis(2-methylphenol), 4,4'-(1-methylethylidene)bis(2,6-dimethylphenol), 4,4',4"-ethylidene tris(2-methylphenol), 4,4',4"-ethylidene trisphenol and 1,1,3-tris(2,5-dimethyl-4-hydroxyphenyl)-3-phenylpropane.

Examples of the high-molecular weight polymers include polymers having a phenolic hydroxyl group, such as novolak resins and polyhydroxystyrene described below, and derivatives thereof. They may be used singly or in combination.

(Novolak Resins)

The alkali-soluble novolak resins for use in the invention are condensation products of m-cresol, one or more types of other phenols, and an aldehyde compound. The alkali-soluble novolak resins are not particularly limited, provided that the m-cresol has a proportion of 50 to 90 mol % relative to all the phenols.

Examples of the other types of phenols as materials of the novolak resins include 2,3-xylenol, 2,4-xylenol, 2,5-xylenol, 3,4-xylenol, 3,5-xylenol and 2,3,5-trimethylphenol. These maybe used either individually or in combination or two or more kinds.

Of the above phenols, 2,3-xylenol, 2,4-xylenol, 3,4-xylenol and 2,3,5-trimethylphenol are preferable.

Preferred examples of m-cresol/phenol(s) combinations include m-cresol/2,3-xylenol, m-cresol/2,4-xylenol, m-cresol/2,3-xylenol/3,4-xylenol, m-cresol/2,3,5-trimethylphenol and m-cresol/2,3-xylenol/2,3,5-trimethylphenol.

Suitable aldehyde compounds for use in the condensation include formaldehyde, paraformaldehyde, acetaldehyde, benzaldehyde, o-hydroxybenzaldehyde, m-hydroxybenzaldehyde, p-hydroxybenzaldehyde, glyoxal, glutaraldehyde, terephthalaldehyde and isophthalaldehyde. Of these, formaldehyde and o-hydroxybenzaldehyde are particularly suitable.

These aldehyde compounds maybe used either individually or in combination or two or more kinds. Preferably, the aldehyde compound(s) will be used in an amount of 0.4 to 2 mol, and more preferably 0.6 to 1.5 mol per mol of the phenols.

The condensation between the phenols and the aldehyde compound is usually carried out in the presence of an acid catalyst. Exemplary acid catalysts include hydrochloric acid, nitric acid, sulfuric acid, formic acid, oxalic acid, acetic acid, methanesulfonic acid and p-toluenesulfonic acid. Generally, the acid catalyst may be used in an amount of $1 \times 10^{-5}$ to $5 \times 10^{-1}$ mol per mol of the phenols.

The condensation is usually performed using water as reaction medium. When it is expected that the reaction system will be heterogeneous from an early stage of the reaction, the water as the reaction medium may be replaced by:

an alcohol such as methanol, ethanol, propanol, butanol or propylene glycol monomethyl ether;

a cyclic ether such as tetrahydrofuran or dioxane; or a ketone such as ethyl methyl ketone, methyl isobutyl ketone or 2-heptanone.

The reaction medium may be used in an amount of 20 to 1,000 parts by weight per 100 parts by weight of the reactants.

Although the condensation temperature may be appropriately adjusted depending on the reactivity of the reactants, it is generally in the range of 10 to 200° C.

The condensation reaction may be carried out in an appropriate manner. For example, the phenols, the aldehyde compound, the acid catalyst, etc. may be introduced into a reactor all at once. Alternatively, the phenols, the aldehyde compound, etc. may be added with progress of the reaction in the presence of the acid catalyst.

After completion of the condensation, the unreacted materials, the acid catalyst, the reaction medium, etc. are removed from the system. For example, this can be made through a process in which the temperature in the reaction system is increased to 130 to 230° C. and the volatile components are evaporated under reduced pressure to recover the novolak resin. Alternative is a process in which the novolak resin obtained is dissolved in a good solvent, followed by mixing with a poor solvent such as water, n-hexane or n-heptane, and the precipitated phase of resin solution is separated to recover the high-molecular weight novolak resin. The good solvents include ethylene glycol monomethyl ether acetate, methyl 3-methoxypropionate, ethyl lactate, methyl isobutyl ketone, 2-heptanone, dioxane, methanol and ethyl acetate.

The novolak resins preferably have a weight-average molecular weight in terms of polystyrene (hereinafter the "Mw") of 2,000 to 20,000, and particularly preferably 3,000 to 15,000, from the viewpoints of workability of the composition into films, and developability, sensitivity and heat resistance of the resulting resist.

(Polyhydroxystyrenes)

Suitable polyhydroxystyrenes for use in the invention include resins commercially available under the trade names of MARUKA LYNCUR M, MARUKA LYNCUR CMM, MARUKA LYNCUR CHM, MARUKA LYNCUR MB, MARUKA LYNCUR PHM-C, MARUKA LYNCUR CST and MARUKA LYNCUR CBA (Maruzen Petrochemical Co., Ltd.).

[Solvent: Component B]

A solvent may be employed for dissolving the component A to prepare a coating solution. The solvents are not particularly limited as long as the component A is favorably dissolved therein. Examples thereof include ethylene glycol monomethyl ether, ethylene glycol monoethyl ether, ethylene glycol monomethyl ether acetate, ethylene glycol monoethyl ether acetate, diethylene glycol monomethyl ether, diethylene glycol monoethyl ether, propylene glycol monomethyl ether acetate, propylene glycol monopropyl ether acetate, toluene, xylene, methyl ethyl ketone, 2-heptanone, 3-heptanone, 4-heptanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-ethoxypropionate, ethyl 3-methoxypropionate, butyl acetate, methyl pyruvate and ethyl pyruvate. Also usable are high-boiling solvents such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate. These solvents may be used singly or in combination of two or more kinds. Of these, ethyl 2-hydroxypropionate and propylene glycol monomethyl ether acetate are preferable.

[Acrylic Resin: Component C]

An alkali-soluble acrylic resin may be added in order to improve application properties and to stabilize coating film properties, particularly when the component A is the low-molecular weight compound having a phenolic hydroxyl group.

The composition of the acrylic resin is not particularly limited, provided that the resin contains a unit derived from a (meth) acrylic ester, and a unit imparting alkali solubility that is derived from a radically polymerizable compound having a carboxyl group and/or a phenolic hydroxyl group.

Examples of the radically polymerizable compounds having a carboxyl group include acrylic acid and methacrylic acid.

Examples of the radically polymerizable compounds having a phenolic hydroxyl group include vinyl monomers having a phenolic hydroxyl group, such as p-hydroxystyrene, m-hydroxystyrene, o-hydroxystyrene, α-methyl-p-hydroxystyrene, α-methyl-m-hydroxystyrene, α-methyl-o-hydroxystyrene, 4-isopropenylphenol, 2-allylphenol, 4-allylphenol, 2-allyl-6-methylphenol, 2-allyl-6-methoxyphenol, 4-allyl-2-methoxyphenol, 4-allyl-2,6-dimethoxyphenol and 4-allyloxy-2-hydroxybenzophenone. These compounds may be used either individually or in combination of two or more kinds. Of the compounds, p-hydroxystyrene and 4-isopropenylphenol are preferred.

The acrylic copolymer contains 1 to 60 wt %, preferably 5 to 50 wt % the unit derived from the carboxyl-containing radically polymerizable compound and/or the unit derived from the phenolic hydroxyl-containing radically polymerizable compound. When the amount is less than 5 wt %, the acrylic copolymer becomes less soluble in the alkaline developing solution, so that the developing results in residual film and poor resolution. When the amount exceeds 50 wt %, the acrylic copolymer has too high a solubility in the alkaline developing solution, so that the two-layer film will have apertures with undercuts.

[Surfactant: Component D]

A surfactant may be added to the composition in order to improve application, defoaming and leveling properties. Suitable surfactants include fluorine-containing surfactants commercially available under the trade names of BM-1000 and BM-1100 (manufactured by BM Chemie); MEGAFACE series F142D, F172, F173 and F183 (manufactured by Dainippon Ink and Chemicals, Incorporated); FLUORAD series FC-135, FC-170C, FC-430 and FC-431 (manufactured by Sumitomo 3M); SURFLON series S-112, S-113, S-131, S-141 and S-145 (manufactured by Asahi Glass Co., Ltd.); and SH-28PA, SH-190, SH-193, SZ-6032 and SF-8428 (manufactured by Toray Dow Corning Silicone Co., Ltd.). The amount of the surfactant is preferably not more than 5 parts by weight per 100 parts by weight of the copolymer (A).

The lower layer material may contain other components. Specific examples thereof include phenol novolak epoxy resins, cresol novolak epoxy resins, bisphenol epoxy resins, trisphenol epoxy resins, tetraphenol epoxy resins, phenol-xylylene epoxy resins, naphthol-xylylene epoxy resins, phenol-naphthol epoxy resins, phenol-dicyclopentadiene epoxy resins and alicyclic epoxy resins. Inorganic fillers are also employable. Specific examples of the inorganic fillers include silica, aluminum hydroxide and barium sulfate. Other employable additives are polymer additives, reactive diluents, leveling agents, wettability improvers, plasticizers, antioxidants, antistatic agents, mildew-proofing agents, moisture conditioners and flame-retardants.

Upper Layer

For the formation of the upper layer, an upper layer material is used that contains a negative radiation-sensitive resin composition. The upper layer material may be a liquid or a dry film.

The radiation-sensitive resin compositions as described in JP-A-H08-301911 may be employed as the negative radiation-sensitive resin composition.

The negative radiation-sensitive resin composition used in the invention includes an acrylic resin (the above component C), a crosslinking agent (component E), an initiator (component F), a solvent (the above component B), and a surfactant (the above component D).

[Crosslinking Agent: Component E]

Exemplary crosslinking agents (components E) include trimethylolpropane tri(meth)acrylate, pentaerythritol tri (meth)acrylate, ethylene glycol di(meth)acrylate, tetraethylene glycol di(meth)acrylate, polyethylene glycol di(meth) acrylate, 1,4-butanediol di(meth)acrylate, butylene glycol di(meth)acrylate, propylene glycol di(meth)acrylate, trimethylolpropane di(meth)acrylate, 1,6-hexanediol di(meth) acrylate, neopentyl glycol di(meth)acrylate, trimethylolpropane tri(meth)acrylate, tris(2-hydroxyethyl)isocyanurate tri (meth)acrylate, tris(2-hydroxyethyl)isocyanurate di(meth) acrylate, tricyclodecanedimethanol di(meth)acrylate, epoxy (meth)acrylate obtained by adding a (meth)acrylic acid to diglycidyl ether of bisphenol A, bisphenol A-di(meth)acryloyloxyethyl ether, bisphenol A-di(meth)acryloyloxy ethyloxy ethyl ether, bisphenol A-di(meth)acryloyloxyloxy methyl ethyl ether, tetramethylolpropane tetra(meth)acrylate, pentaerythritol tri(meth)acrylate, pentaerythritol tetra (meth)acrylate, dipentaerythritol penta(meth)acrylate and dipentaerythritol hexa(meth)acrylate.

Commercially available compounds may be used as the crosslinking agents (components E). Examples thereof include compounds commercially available under the trade names of ARONIX series M-210, M-309, M-310, M-400, M-7100, M-8030, M-8060, M-8100, M-9050, M-240, M-245, M-6100, M-6200, M-6250, M-6300, M-6400 and M-6500 (manufactured by Toagosei Co., Ltd.); KAYARAD series R-551, R-712, TMPTA, HDDA, TPGDA, PEG400DA, MANDA, HX-220, HX-620, R-604, DPCA-20, DPCA-30, DPCA-60 and DPCA-120 (manufactured by Nippon Kayaku Co., Ltd.); and Biscoat series Nos. 295, 300, 260, 312, 335HP, 360, GPT, 3PA and 400 (manufactured by Osaka Organic Chemical Industry Ltd.)

These crosslinking agents (components E) may be used singly or in combination of two or more kinds. Preferably, the crosslinking agent is used in an amount of 10 to 250 parts by weight, more preferably 20 to 200 parts by weight, and particularly preferably 25 to 150 parts by weight per 100 parts by weight of the acrylic resin (component C). When the amount is less than 10 parts by weight, the photosensitivity tends to be lowered. When the amount exceeds 250 parts by weight, the compatibility with the copolymer (A) will be deteriorated, leading to poor storage stability and difficulties in achieving the film thickness of 20 μm or more.

[Radiation-induced Radical Polymerization Initiator: Component F]

Examples of the radiation-induced radical polymerization initiators (hereinafter, the initiators or components (F)) for use in the invention include α-diketones such as benzyl and diacetyl; acyloins such as benzoin; acyloin ethers such as benzoin methyl ether, benzoin ethyl ether and benzoin isopropyl ether; benzophenones such as thioxanthone, 2,4-diethyl thioxanthone, thioxanthone-4-sulfonic acid, benzophenone, 4,4'-bis(dimethylamino)benzophenone and 4,4'-bis(diethylamino)benzophenone; acetophenones such as acetophenone, p-dimethylaminoacetophenone, α,α-dimethoxy-α-acetoxybenzophenone, α,α-dimethoxy-α-phenylacetophenone, p-methoxyacetophenone, 1-[2-methyl-4-methylthiophenyl]-2-morpholino-1-propanone, α,α-dimethoxy-α-morpholino-methylthiophenyl acetophenone and 2-benzyl-2-dimethylamino-1-(4-morpholinophenyl)-butane-1-one; quinones such as anthraquinone and 1,4-naphthoquinone; halides such as phenacyl chloride, tribromomethylphenylsulfone and tris (trichloromethyl)-s-triazine; bisimidazoles such as [1,2'-bisimidazole]-3,3',4,4'-tetraphenyl and [1,2'-bisimidazole]-1,2'-dichlorophenyl-3,3',4,4'-tetraphenyl; peroxides such as di-tert-butyl peroxide; and acylphosphine oxides such as 2,4,6-trimethylbenzoyldiphenylphosphine oxide. Commercially available initiators include IRGACURE series 184, 651, 500, 907, CGI369 and CG24-61 (manufactured by Ciba Specialty Chemicals Inc.); LUCIRIN LR8728 and LUCIRIN TPO (manufactured by BASF); DAROCUR series 1116 and 1173 (manufactured by Ciba Specialty Chemicals Inc.); and UBECRYL P36 (manufactured by UCB). Where necessary, the above radiation-induced radical polymerization initiators may be used in combination with hydrogen donor compounds such as mercaptobenzothiazole and mercaptobenzoxazole.

Of the radiation-induced radical polymerization initiators, preferable are the acetophenones such as 1-[2-methyl-4-methylthiophenyl]-2-morpholino-1-propanone, 2-benzyl-2-dimethylamino-1-(4-morpholinophenyl)-butane-1-one and α,α-dimethoxy-α-phenylacetophenone; phenacyl chloride and tribromomethylphenylsulfone; 2,4,6-trimethylbenzoyl-diphenylphosphine oxide; combinations of the 1,2'-bisimidazoles and 4,4'-diethylaminobenzophenone and mercaptobenzothiazole; LUCIRIN TPO; and IRGACURE 651. These compounds may be used singly or in combination of two or more kinds. Preferably, the initiator is used in an amount of 0.1 to 60 parts by weight, more preferably 5 to 50 parts by weight, and particularly preferably 10 to 40 parts by weight per 100 parts by weight of the alkali-soluble copolymer (A) When the amount is less than 1 wt %, radicals are more liable to be deactivated by oxygen (leading to deteriorated sensitivity). The amount exceeding 60 wt % tends to cause poor compatibility and low storage stability. The radiation-induced radical polymerization initiators may be used in combination with radiation sensitizers.

Method of Forming Lower and Upper Layers

On a substrate having predetermined wiring patterns, the lower layer is formed by application or lamination, and thereafter the upper layer is formed by application or lamination. Thus, a desired laminated two-layer film may be produced. When the material is liquid, the application may be performed by dipping, spin coating, roll coating or screen process printing, or by use of an applicator or a curtain coater. When the material is a film, lamination or vacuum lamination may be adopted. Drying conditions for the lower and upper layers vary depending on the kinds and proportions of the components making up the composition and the coating thickness. Generally, the drying is performed at temperatures in the range of 70 to 120° C., and preferably 80 to 100° C, for about 5 to 20 minutes. When the drying time is too short, adhesion may be bad at the time of development. Any overlong drying causes an excessive thermal change that leads to lowering of the resolution.

It is also possible that the lower layer material and the upper layer material are in advance formed into a two-layer dry film and laminated on the substrate.

Irradiation Method

The laminated film obtained as described above is then irradiated with ultraviolet rays or visible rays of 300 to 500 nm wavelength, through a photomask having a desired pattern. Exemplary radiation sources include low-pressure, high-pressure and super-high-pressure mercury lamps, metal halide lamps and argon gas lasers. As used herein, the radiations include ultraviolet rays, visible rays, far ultraviolet rays, X-rays and electron beams. The dose of radiation varies depending on the kinds and proportions of the components making up the composition and the film thickness; for example, it is in the range of 100 to 500 mJ/cm$^2$ in the case of super-high-pressure mercury lamps.

Developing Method

After the irradiation, development is carried out using an alkaline aqueous solution as a developer, so that unnecessary portions are dissolved and removed while radiation-exposed portions remain. Exemplary developers include alkaline aqueous solutions of sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene and 1,5-diazabicyclo[4.3.0]-5-nonane. The developing solution may be a mixture of the above alkaline aqueous solution and an appropriate amount of a water-soluble organic solvent, such as methanol or ethanol, or a surfactant. The development time varies depending on the kinds and proportions of the components making up the composition and the film thickness; for example, it is usually in the range of 30 to 360 seconds. The developing method may be any of dropping, dipping, paddling and spraying. After the development, the patterned film is washed under running water for 30 to 90 seconds and thereafter air dried using an air gun or dried in an oven.

As a result of the above development using the developing solution, the irradiated area of the upper layer is left and the lower layer is dissolved and removed correspondingly to the removed area (non-irradiated area) of the upper layer.

The remaining resist layers may be subjected to post photoexposure or heating to be further cured.

Formation of Bumps

Subsequently, the low-melting metal such as solder paste is filled in the aperture pattern as described above, and the metal is reflowed to form bumps. Alternatively, the low-melting metal may be filled in the aperture pattern by direct placement of solder balls or electrolytic deposition.

Peeling Treatment

After the bumps are formed, the cured layers (resist layers) remaining on the substrate are peeled. The peeling may be performed by, for example, immersing the substrate in a peeling solution at 50 to 80° C. with agitation for 5 to 30 minutes. Preferred peeling solutions used herein include dimethyl sulfoxide, and a mixed solution of quaternary ammonium salt, dimethyl sulfoxide and water.

Specifically, the laminated two-layer film maybe peeled and removed from the substrate with use of a peeling apparatus having multistage immersion baths. The treatment may be designed to peel the laminated two-layer film in the first bath containing an appropriate organic solvent, followed by cycle filtration of the peeled pieces, and to peel the residual laminated film in the second and later baths filled with a peeling solution containing an organic alkali component.

Alternatively, the treatment may be preferably designed to peel the laminated two-layer film in the first bath containing dimethyl sulfoxide, followed by cycle filtration of the peeled pieces, and to peel the residual laminated film in the second and later baths filled with a peeling solution containing an organic alkali component and dimethyl sulfoxide.

EXAMPLES

Hereinbelow, the present invention will be described in greater detail by Examples. However, it should be construed that the invention is not limited thereto. Unless otherwise mentioned, part(s) and % refer to part(s) by weight and % by weight.

Raw materials for the lower layer and upper layer materials are listed below.

(Component A: Compound Having a Phenolic Hydroxyl Group)

A-1: m-Cresol and p-cresol were mixed together in a weight ratio of 40:60, followed by addition of formalin. The resultant mixture was condensed by a conventional method under catalysis by oxalic acid to give a cresol novolak. The resin was then subjected to fractionation to remove low-molecular weight fractions. Thus, a novolak resin with a weight-average molecular weight of 12,000 was obtained.

A-2: 4,4'-[1-[4[1-(4-hydroxyphenyl)-1-methylethyl]phenyl]ethylidene]diphenol (Component B: Solvent)

B-1: propylene glycol monomethyl ether
B-2: ethyl 2-hydroxypropionate
B-3: 2-heptanone (Component C: Acrylic Resin)

C-1:

A flask equipped with a dry ice/methanol reflux condenser and a thermometer was purged with nitrogen. The flask was then charged with 4.0 g of 2,2'-azobisisobutyronitrile as polymerization initiator, and 120 g of ethyl 2-hydroxypropionate as solvent. They were stirred until the polymerization initiator was dissolved in the solvent. Subsequently, 20.0 g of acrylic acid, 10.0 g of p-isopropenylphenol, 30.0 g of n-butyl methacrylate, 20.0 g of methyl methacrylate and 20.0 g of n-butyl acrylate were introduced into the flask. The contents were stirred slowly to give a solution. The solution was then heated to 80° C., and polymerization was carried out at the temperature for 4 hours. The solution temperature was raised to 100° C. and polymerization was performed at the temperature for 1 hour. Thereafter, the solution was allowed to cool to room temperature, and the gas in the flask was replaced with air. The solution obtained by the above reaction was added dropwise to a large quantity of methanol to coagulate the reaction product. The coagulated product was washed with water, redissolved in tetrahydrofuran of the same weight as the coagulated product, and recoagulated in a large amount of methanol. The operation of redissolution through recoagulation was carried out three times in total. The coagulated product thus obtained was vacuum dried at 40° C. for 48 hours to yield an acrylic resin C-1.

C-2:

A flask equipped with a dry ice/methanol reflux condenser and a thermometer was purged with nitrogen. The flask was then charged with 4.0 g of 2,2'-azobisisobutyronitrile as polymerization initiator, and 100 g of ethyl 2-hydroxypropionate as solvent. They were stirred until the polymerization initiator was dissolved in the solvent. Subsequently, 10.0 g of methacrylic acid, 15.0 g of p-isopropenylphenol, 25.0 g of 8-tricyclo[5.2.1.02.6]decanyl methacrylate, 20 g of isobornyl acrylate and 30.0 g of n-butyl acrylate were introduced into the flask. The contents were stirred slowly to give a solution. The solution was then heated to 80° C., and polymerization was carried out at the temperature for 3 hours. After addition of 1 g of 2,2'-azobisisobutyronitrile, polymerization was conducted at 80° C. for 3 hours. The solution temperature was raised to 100° C. andpolymerizationwas performed at the temperature for 1 hour. Thereafter, the solution was allowed to cool to room temperature, and the gas in the flask was replaced with air. The solution obtained by the above reaction was added dropwise to a large quantity of methanol to coagulate the reaction product. The coagulated product was washed with water, redissolved in tetrahydrofuran of the same weight as the coagulated product, and recoagulated in a large amount of methanol. The operation of redissolution through recoagulation was carried out three times in total. The coagulated product thus obtained was vacuum dried at 40° C. for 48 hours to yield an acrylic resin C-2.

C-3:

A flask equipped with a dry ice/methanol reflux condenser and a thermometer was purged with nitrogen. The flask was then charged with 3.0 g of 2,2'-azobisisobutyronitrile as polymerization initiator, and 150 g of ethyl 2-hydroxypropionate as solvent. They were stirred until the polymerization initiator was dissolved in the solvent. Subsequently, 43 g of 4-isopropenylphenol, 30.8 g of n-butyl acrylate, 2.9 g of acrylic acid and 23.3 g of 2-hydroxyethyl acrylate were introduced into the flask. The contents were stirred slowly to give a solution. The solution was then heated to 70° C., and polymerization was carried out at the temperature for 3 hours. After addition of 1.5 g of the polymerization initiator 2,2'-azobisisobutyronitrile, polymerization was conducted at 70° C. for 3 hours. Thereafter, the solution was allowed to cool to room temperature, and the gas in the flask was replaced with air, followed by addition of 150 mg of p-methoxyphenol. The solution obtained by the above reaction was added dropwise to a large quantity of methanol to coagulate the reaction product. The coagulated product was washed with water, redissolved in tetrahydrofuran of the same weight as the coagulated product, and recoagulated in a large amount of methanol. The operation of redissolution through recoagulation was carried out three times in total. The coagulated product thus obtained was vacuum dried at 40° C. for 48 hours to yield an acrylic resin C-3.

(Component D: Surfactant)

D-1: NBX-15 (available from Neos Co., Ltd.)
D-2: SF-8428 (available from Toray Silicone)

(Component E: Crosslinking Agent)

E-1: ARONIX M-8060 (available from Toagosei Co., Ltd.)

(Component F: Initiator)

F-1: IRGACURE 651 (available from Ciba Specialty Chemicals Inc.)
F-2: KAYACURE DETX-S (available from NIPPON KAYAKU CO., LTD.)

Preparation of Lower Layer Materials A-L, B-L and C-L

As shown in Table 1, 35 parts of A-1, 65 parts of B-1 and 0.1 part of D-1 were stirred to give a solution. The solution was filtered through a membrane filter having a pore size of 3 μm (capsule cartridge filter CCP-FX-C1B available from ADVANTEC), and a lower layer material A-L was obtained. Lower layer materials B-L and C-L were prepared in a similar manner.

Preparation of Lower Layer Materials B-D and C-D

Dry films were prepared from the lower layer materials B-L and C-L, as follows. The lower layer material B-L was spin coated over an 11 cm-square polyethyleneterephthalate (PET) film having a thickness of 50 μm so that the post baking film thickness would be 5 μm. The coating was baked in a convection oven at 110° C. for 10 minutes to give a lower layer material B-D. A lower layer material C-D was produced in a similar manner.

TABLE 1

| Lower layer material | Component A | Component B | Component C | Component D | Material state |
|---|---|---|---|---|---|
| A-L | A-1 35 parts | B-1 65 parts | — | D-1 0.1 part | Liquid |
| B-L | A-2 20 parts | B-2 90 parts | C-1 10 parts | — | Liquid |
| B-D | A-2 20 parts | B-2 90 parts | C-1 10 parts | — | Dry film |
| C-L | A-2 20 parts | B-2 90 parts | C-3 20 parts | D-1 0.1 part | Liquid |
| C-D | A-2 20 parts | B-2 90 parts | C-3 20 parts | D-1 0.1 part | Dry film |

Preparation of Upper Layer Materials A-L, B-L and C-L

These upper layer materials were prepared from the components as shown in Table 2, in the same manner as the lower layer material A-L.

Preparation of Upper Layer Materials A-D and B-D

Dry films were prepared from the upper layer materials A-L and B-L, as follows. The upper layer material A-L was spin coated over an 11 cm-square polyethyleneterephthalate (PET) film having a thickness of 50 μm so that the post baking film thickness would be 40 μm. The coating was baked in a convection oven at 110° C. for 10 minutes to give an upper layer material A-D. An upper layer material B-D was produced in a similar manner.

TABLE 2

| Upper layer material | Component B | Component C | Component D | Component E | Component F | Material state |
|---|---|---|---|---|---|---|
| A-L | B-1 88 parts | C-2 100 parts | D-1 0.1 part | E-1 51.7 parts | F-1 18.6 parts F-2 4.0 parts | Liquid |
| A-D | B-1 88 parts | C-2 100 parts | D-1 0.1 part | E-1 51.7 parts | F-1 18.6 parts F-2 4.0 parts | Dry film |
| B-L | B-2 122 parts | C-1 100 parts | D-2 0.3 part | E-1 45 parts | F-1 30 parts | Liquid |
| B-D | B-2 122 parts | C-1 100 parts | D-2 0.3 part | E-1 45 parts | F-1 30 parts | Dry film |
| C-L | B-3 88 parts | C-2 100 parts | D-1 0.1 part | E-1 51.7 parts | F-1 18.6 parts F-2 4.0 parts | Liquid |

TABLE 3

| Two-layer dry film | Upper layer material | Lower layer material |
|---|---|---|
| A | B-L | B-L |
| B | C-L | C-L |

Preparation of Peeling Solution

Peeling solution: A peeling solution 1 was prepared by adding 100 g of an aqueous tetramethylammoniumhydroxide solution (25 wt %) to 4900 g of dimethyl sulfoxide, followed by stirring.

Preparation of Two-layer Dry Films A and B

Two-layer dry films were prepared from combinations shown in Table 3, as follows. The upper layer material B-L was spin coated over an 11 cm-square polyethyleneterephthalate (PET) film having a thickness of 50 μm so that the post baking film thickness would be 40 μm. The coating was baked in a convection oven at 110° C. for 10 minutes. Subsequently, the lower layer material B-L was spin coated over the coated substrate so that the post baking film thickness would be 40 μm. The coating was baked in a convection oven at 110° C. for 10 minutes. Thus, a two-layer dry film A was obtained. A two-layer dry film B was prepared in a similar manner.

Preparation of Evaluation Board A

On a 4-inch silicon wafer, a chromium layer was sputtered in a thickness of 1000 angstroms, and a copper layer was sputtered thereon in a thickness of 1000 angstroms. Thus, an evaluation board A was prepared.

Preparation of Evaluation Board B

A surface-roughened, copper-clad glass epoxy laminate (substrate thickness: 0.6 mm, size: 10 cm square) was coated with a solder resist (product of JSR, the photosensitive insulating resin composition described in Example 1 of Japanese Patent Application No. 2000-334348). The solder resist contained (i) a cresol novolak resin containing m-cresol and p-cresol in a molar ratio of 60/40 (weight-average molecular weight in terms of polystyrene: 8700), (ii) hexamethoxymethylmelamine, (iii) crosslinked fine particles, (iv) styryl-bis(trichloromethyl)-s-triadine, and (v) ethyl lactate as solvent. The coating was heated in a convection oven at 90° C. for 10 minutes to give a uniform film having a thickness of 30 µm. Subsequently, the film was photoexposed through a pattern mask with ultraviolet rays from a high-pressure mercury lamp with use of an aligner (MA-150, available from Suss Microtech Inc.) in a manner such that the dose was in the range of 300 to 500 mJ/cm$^2$ at a wavelength of 350 nm. Thereafter, PEB (post exposure baking) was performed in a convection oven at 90° C. for 15 minutes. The film was then developed by being showered with a 1-wt % sodium hydroxide aqueous solution having a temperature of 30° C. over a period of 2 to 3 minutes (pressure: 3 kgf·cm$^2$). The developed film was photoexposed in a dose of 1000 mJ/cm$^2$ at 350 nm wavelength with use of a high-pressure mercury lamp, and was subsequently heated in a convection oven at 150° C. for 2 hours and at 170° C. for 2 hours. Thus, a cured film was produced.

The board thus obtained had a first aperture pattern which was a combination of:

Hole pattern of 95 µm-diameter holes at 150 µm pitch;
Hole pattern of 80 µm-diameter holes at 125 µm pitch; and
Hole pattern of 60 µm-diameter holes at 100 µm pitch.

The apertures of the board were electroless plated with Ni and Au. An evaluation board B was thus obtained.

Spin Coating Method

The liquid lower layer material or upper layer material was directly dropped on the evaluation board, and was spread by means of a spin coater so as to achieve a post baking film thickness of 40 µm. The coating was baked in a convection oven at 110° C. for 10 minutes. The coated board was gradually cooled to room temperature, and the coated surface was covered with a 50 µm thick PET film with use of a laminator.

Lamination conditions were as follows:
Roll temperature: 80° C.
Roll pressure: 0.4 MPa
Transportation speed: 0.5 m/min.

Lamination Method

The dry-film lower layer and upper layer materials, or the two-layer dry film was laminated on the board with use of a laminator. The PET film substrate was left unreleased.

Lamination conditions were as follows:
Roll temperature: 120° C.
Roll pressure: 0.4 MPa
Transportation speed: 0.5 m/min.

Example 1

<Application>

The lower layer material A-L was spin coated over the evaluation board A, and the coating was baked on a hot plate at 120° C. for 5 minutes to give a lower layer 5 µm thick. On the lower layer, the upper layer material A-L was spin coated, and the coating was baked on a hot plate at 120° C. for 5 minutes to give an upper layer having a thickness of 65 µm.

<Photoexposure>

The laminated film was photoexposed through a patterned glass mask with ultraviolet rays from a high-pressure mercury lamp with use of an aligner (MA-150, available from Suss Microtech Inc.) in a manner such that the dose was 1000 mJ/cm$^2$ at a wavelength of 420 nm. During the photoexposure, the glass mask was brought into intimate contact with the board covered with the PET film.

<Development>

The above-photoexposed board was subjected to paddle development in an aqueous solution containing 2.38% tetramethylammoniumhydroxide (hereinafter, abbreviated as TMAH developing solution). The developer application time was generally 90 seconds and adjusted by 15 seconds. After the development, the board was rinsed with ion-exchange water for 60 seconds.

The patterned board had a plurality of hole patterns of 75 µm×75 µm apertures.

After the development, the pattern configuration was inspected with an optical microscope and a scanning electron microscope, and was evaluated based on the following criteria. The results are set forth in Table 4.

Pattern configuration:
AA: A hole pattern having 75 µm×75 µm apertures had been developed with no residual film, no floating or no peeling, and the development had completed allowing a margin of development time.
CC: A hole pattern having 75 µm×75 µm holes had residual film, floating or peeling, and the development did not allow a margin of development time.

<Solder Filing>

The entire surface of the laminated two-layer film was coated with a solder paste with use of a squeegee, and thereby solder-bump formation concave apertures were completely filled with the solder paste. The solder paste used herein contained Sn and Ag in a weight ratio of 96.5:3.5 and contained solder particles 5 to 20 µm in diameter. The viscosity thereof had been adjusted to 200 Pa·s. Thereafter, the solder paste was removed using a squeegee from the surface other than within the solder-bump formation apertures. The paste was completely removed with cleaning paper, and the surface of the solder paste was flattened.

<Reflowing>

The solder paste printed in the above step was reflowed at 250° C., followed by flux cleaning.

<Peeling>

After the reflowing, the board was cooled to room temperature. Separately, approximately 1 liter of dimethyl sulfoxide or the peeling solution 1 was placed in a peeling bath and heated to about 60° C. The board was immersed in the bath for 10 minutes under agitation, and thereby the laminated two-layer film was peeled.

The board having been peeling treated in the peeling bath was rinsed with isopropyl alcohol and washed with water, and was dried using an air gun.

After the peeling treatment, the board surface and the solder bumps were inspected with an optical microscope and a scanning electron microscope, and were evaluated based on the following criteria. The results are set forth in Table 4.

Evaluation criteria
Peelability with DMSO
AA: Most of the laminated two-layer film was peeled.
CC: The laminated two-layer film was not peeled.
Peelability with the peeling solution 1
AA: No residual film was observed on the board.
CC: Residual film was observed on the board.

Example 2

<Application>

The lower layer material A-L was spin coated over the evaluation board A, and the coating was baked on a hot plate at 120° C. for 5 minutes to give a lower layer 5 μm thick. On the lower layer, the upper layer material A-D (thickness: 65 μm) was laminated.

The other procedures were carried out in the same manner as in Example 1.

Example 3

The lower layer material B-L was spin coated over the evaluation board B, and the coating was baked in a clean oven at 110° C. for 10 minutes to give a lower layer 2 μm thick. On the lower layer, the upper layer material B-L was spin coated, and the coating was baked at 110° C. for 10 minutes to give an upper layer having a thickness of 40 μm.

<Patterning>

The laminated film was photoexposed through a patterned glass mask with ultraviolet rays from a high-pressure mercury lamp with use of an aligner (MA-150, available from Suss Microtech Inc.) in a manner such that the dose was 400 mJ/cm² at a wavelength of 350 nm. During the photoexposure, the glass mask was brought into intimate contact with the board covered with the PET film.

In the photoexposure, the hole pattern (first aperture pattern) of the evaluation board was aligned with a second aperture pattern of the radiation-sensitive resin composition.

The above-photoexposed board was subjected to development by being showered with a 1 wt % sodium carbonate aqueous solution having a temperature of 30° C. (pressure: 1 kgf·cm²). The showering time was generally 45 seconds and adjusted by 15 seconds.

The board had the following first and second aperture patterns.

|  | First aperture pattern | Second aperture pattern |
| --- | --- | --- |
| 150 μm pitch | 95 μm-diameter holes | 100 μm-diameter holes |
| 125 μm pitch | 80 μm-diameter holes | 90 μm-diameter holes |
| 100 μm pitch | 60 μm-diameter holes | 80 μm-diameter holes |

After the development, the pattern configuration was inspected with an optical microscope and a scanning electron microscope, and was evaluated based on the following criteria. The results are set forth in Table 4.

Developability:

AA: The second aperture pattern had been developed with no residual film, no floating or no peeling, and the development had completed allowing a margin of development time.

CC: The second aperture pattern had residual film, floating or peeling, and the development did not allow a margin of development time.

The other procedures were carried out in the same manner as in Example 1.

Example 4

<Application>

The lower layer material B-L was spin coated over the evaluation board B, and the coating was baked on a hot plate at 120° C. for 5 minutes to give a lower layer 2 μm thick. On the lower layer, the upper layer material B-D (thickness: 40 μm) was laminated.

The other procedures were carried out in the same manner as in Example 3.

Example 5

The lower layer material B-L was spin coated over the evaluation board B, and the coating was baked in a clean oven at 110° C. for 10 minutes to give a lower layer 2 μm thick. On the lower layer, the upper layer material A-L was spin coated, and the coating was baked in a clean oven at 110° C. for 10 minutes to give an upper layer having a thickness of 40 μm.

The other procedures except the development were carried out in the same manner as in Example 4.

<Development>

The photoexposed board was subjected to development by being showered with a 1% sodium hydroxide aqueous solution (hereinafter, abbreviated as NaOH developing solution) having a temperature of 30° C. (pressure: 1 kgf·cm²). The showering time was generally 45 seconds and adjusted by 15 seconds. After the development, the board was rinsed with ion-exchange water for 60 seconds.

Example 6

The lower layer material B-L was spin coated over the evaluation board B, and the coating was baked on a hot plate at 120° C. for 5 minutes to give a lower layer 2 μm thick. On the lower layer, the upper layer material B-D (thickness: 40 μm) was laminated.

The other procedures were carried out in the same manner as in Example 5.

Example 7

The lower layer material B-D was laminated on the evaluation board B to provide a lower layer of 2 μm thickness. On the lower layer, the upper layer material B-L was spin coated, and the coating was baked in a clean oven at 110° C. for 10 minutes to give an upper layer having a thickness of 40 μm.

The other procedures were carried out in the same manner as in Example 3.

Example 8

The lower layer material B-D was laminated on the evaluation board B to provide a lower layer of 2 μm thickness. On the lower layer, the upper layer material B-D (thickness: 40 μm) was laminated.

The other procedures were carried out in the same manner as in Example 3.

Example 9

The two-layer dry film A was laminated on the evaluation board B.

The other procedures were carried out in the same manner as in Example 3.

Example 10

The two-layer dry film B was laminated on the evaluation board B.

The other procedures were carried out in the same manner as in Example 5.

Comparative Examples 1 to 4

Comparative Examples 1 to 4 were carried out in the same manner as in Examples bearing the corresponding number, except that no lower layer was provided.

TABLE 4

| | Lower layer material | Upper layer material | Board | Developing solution | Pattern configuration | Peelability (DMSO) | Peelability (Peeling solution 1) |
|---|---|---|---|---|---|---|---|
| Ex. 1 | A-L | A-L | A | TMAH | AA | AA | AA |
| Ex. 2 | A-L | A-D | A | TMAH | AA | AA | AA |
| Ex. 3 | B-L | B-L | B | Na$_2$CO$_3$ | AA | AA | AA |
| Ex. 4 | B-L | B-D | B | Na$_2$CO$_3$ | AA | AA | AA |
| Ex. 5 | B-L | A-L | B | NaOH | AA | AA | AA |
| Ex. 6 | B-L | A-D | B | NaOH | AA | AA | AA |
| Ex. 7 | B-D | B-L | B | Na$_2$CO$_3$ | AA | AA | AA |
| Ex. 8 | B-D | B-D | B | Na$_2$CO$_3$ | AA | AA | AA |
| Ex. 9 | Two-layer dry film A | | B | Na$_2$CO$_3$ | AA | AA | AA |
| Ex. 10 | Two-layer dry film B | | B | NaOH | AA | AA | AA |
| Comp. Ex. 1 | — | A-L | A | TMAH | AA | CC | CC |
| Comp. Ex. 2 | — | A-D | A | TMAH | AA | CC | CC |
| Comp. Ex. 3 | — | B-L | B | Na$_2$CO$_3$ | AA | CC | CC |
| Comp. Ex. 4 | — | B-D | B | Na$_2$CO$_3$ | AA | CC | CC |

The invention claimed is:

1. A process for forming bumps on electrode pads, for a wiring board including a substrate and a plurality of electrode pads, the process comprising:
   (a) forming a laminated two-layer film on the wiring board and forming a pattern of apertures at positions corresponding to the electrode pads, the laminated two-layer film including a lower layer comprising an alkali-soluble radiation-nonsensitive resin composition and an upper layer comprising a negative radiation-sensitive resin composition;
   (b) filling a low-melting metal in the aperture pattern;
   (c) reflowing the low-melting metal by pressing or heating to form bumps; and
   (d) peeling and removing the laminated two-layer film from the wiring board.

2. The process for forming bumps according to claim 1, wherein the radiation-nonsensitive resin composition contains a compound having a phenolic hydroxyl group.

3. The process for forming bumps according to claim 1, wherein the negative radiation-sensitive resin composition contains an acrylic resin.

4. The process for forming bumps according to claim 1, wherein the lower layer of the laminated two-layer film is formed from the radiation-nonsensitive resin composition that is in a form of liquid or dry film.

5. The process for forming bumps according to claim 1, wherein the upper layer of the laminated two-layer film is formed from the negative radiation-sensitive resin composition that is in a form of liquid or dry film.

6. The process for forming bumps according to claim 1, wherein the laminated two-layer film comprises a two-layer dry film including the lower and upper layers.

7. The process for forming bumps according to claim 1, wherein the peeling and removing is performed with use of a peeling apparatus having multistage immersion baths and comprises peeling the laminated two-layer film in a first bath containing an organic solvent, followed by cycle filtration of peeled pieces, and peeling the residual laminated film in a second and later baths filled with a peeling solution containing an organic alkali component.

8. The process for forming bumps according to claim 1, wherein the peeling and removing is performed with use of a peeling apparatus having multistage immersion baths and comprises peeling the laminated two-layer film in a first bath containing dimethyl sulfoxide, followed by cycle filtration of peeled pieces, and peeling the residual laminated film in a second and later baths filled with a peeling solution containing an organic alkali component and dimethyl sulfoxide.

9. The process for forming bumps according to claim 1, wherein the wiring board comprises a substrate comprising silicon wafer, and a plurality of electrode pads provided on a surface of the substrate.

10. The process for forming bumps according to claim 1, wherein the wiring board comprises a substrate comprising silicon wafer, a plurality of electrode pads provided on a surface of the substrate, and a passivation film formed so as to embed side surfaces and end surfaces of the electrode pads.

11. The process for forming bumps according to claim 1, wherein the wiring board comprises a substrate comprising glass epoxy resin or bismaleimide-triadine resin, and a plurality of electrode pads.

12. The process for forming bumps according to claim 1, wherein the wiring board comprises a substrate comprising glass epoxy resin or bismaleimide-triadine resin, an insulating resin interlayer and a conductive circuit formed on the substrate, and a plurality of electrode pads provided on the conductive circuit.

13. The process for forming bumps according to claim 1, wherein the low-melting metal is solder.

* * * * *